US011476366B2

(12) United States Patent
Ma et al.

(10) Patent No.: US 11,476,366 B2
(45) Date of Patent: Oct. 18, 2022

(54) TRANSISTOR INCLUDING WRAP AROUND SOURCE AND DRAIN CONTACTS

(71) Applicant: Intel Corporation, Santa Clara, CA (US)

(72) Inventors: Sean Ma, Portland, OR (US); Abhishek Sharma, Hillsboro, OR (US); Gilbert Dewey, Beaverton, OR (US); Jack T. Kavalieros, Portland, OR (US); Van H. Le, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1051 days.

(21) Appl. No.: 15/943,584

(22) Filed: Apr. 2, 2018

(65) Prior Publication Data

US 2019/0305136 A1    Oct. 3, 2019

(51) Int. Cl.
*H01L 29/786*    (2006.01)
*H01L 29/417*    (2006.01)
*H01L 29/49*    (2006.01)
*H01L 27/12*    (2006.01)
*H01L 29/78*    (2006.01)

(52) U.S. Cl.
CPC .... *H01L 29/78618* (2013.01); *H01L 27/1211* (2013.01); *H01L 29/41733* (2013.01); *H01L 29/41791* (2013.01); *H01L 29/4908* (2013.01); *H01L 2029/7858* (2013.01)

(58) Field of Classification Search
CPC ......... H01L 29/78618; H01L 29/41733; H01L 29/41791; H01L 27/1211; H01L 27/2902
See application file for complete search history.

(56) References Cited

U.S. PATENT DOCUMENTS

| | | | |
|---|---|---|---|
| 6,759,283 B2* | 7/2004 | Yasuda | H01L 29/66765 257/E21.414 |
| 9,997,632 B2* | 6/2018 | Chang | H01L 29/518 |
| 2012/0126223 A1* | 5/2012 | Maeng | H01L 29/7869 257/43 |
| 2012/0326126 A1* | 12/2012 | Chen | H01L 51/0023 257/29 |

\* cited by examiner

*Primary Examiner* — Dale E Page
*Assistant Examiner* — Quovaunda Jefferson
(74) *Attorney, Agent, or Firm* — Schwabe, Williamson & Wyatt P.C.

(57) ABSTRACT

A transistor is described. The transistor includes a substrate, a first semiconductor structure above the substrate, a second semiconductor structure above the substrate, a source contact that includes a first metal structure that contacts a plurality of surfaces of the first semiconductor structure and a drain contact that includes a second metal structure that contacts a plurality of surfaces of the second semiconductor structure. The transistor also includes a gate below a back side of the substrate.

7 Claims, 7 Drawing Sheets

TRANSISTOR INCLUDING WRAP AROUND SOURCE AND DRAIN CONTACTS

TECHNICAL FIELD

Embodiments of the present disclosure relate to transistors that include source and drain contacts, and more particularly to transistors that include wrap around source and drain contacts.

BACKGROUND

The scaling of features in integrated circuits is a driving force of semiconductor fabrication. Scaling to smaller and smaller features enables increased densities of functional units on the limited real estate of semiconductor chips. For example, shrinking transistor size allows for the incorporation of an increased number of memory or logic devices on a chip, leading to the fabrication of products with increased capacity. The pursuit of ever-increasing capacity, however, is not without issue.

The scaling of contacts of transistors to improve chip density results in increased contact resistance in transistors with scaled contacts. The increased contact resistance degrades transistor performance. Because conventional approaches do not enable the scaling of contact areas of the transistors without increasing contact resistance, the capacity to scale contacts of transistors to increase density per unit area is limited.

DESCRIPTION OF THE EMBODIMENTS

Figure 1:
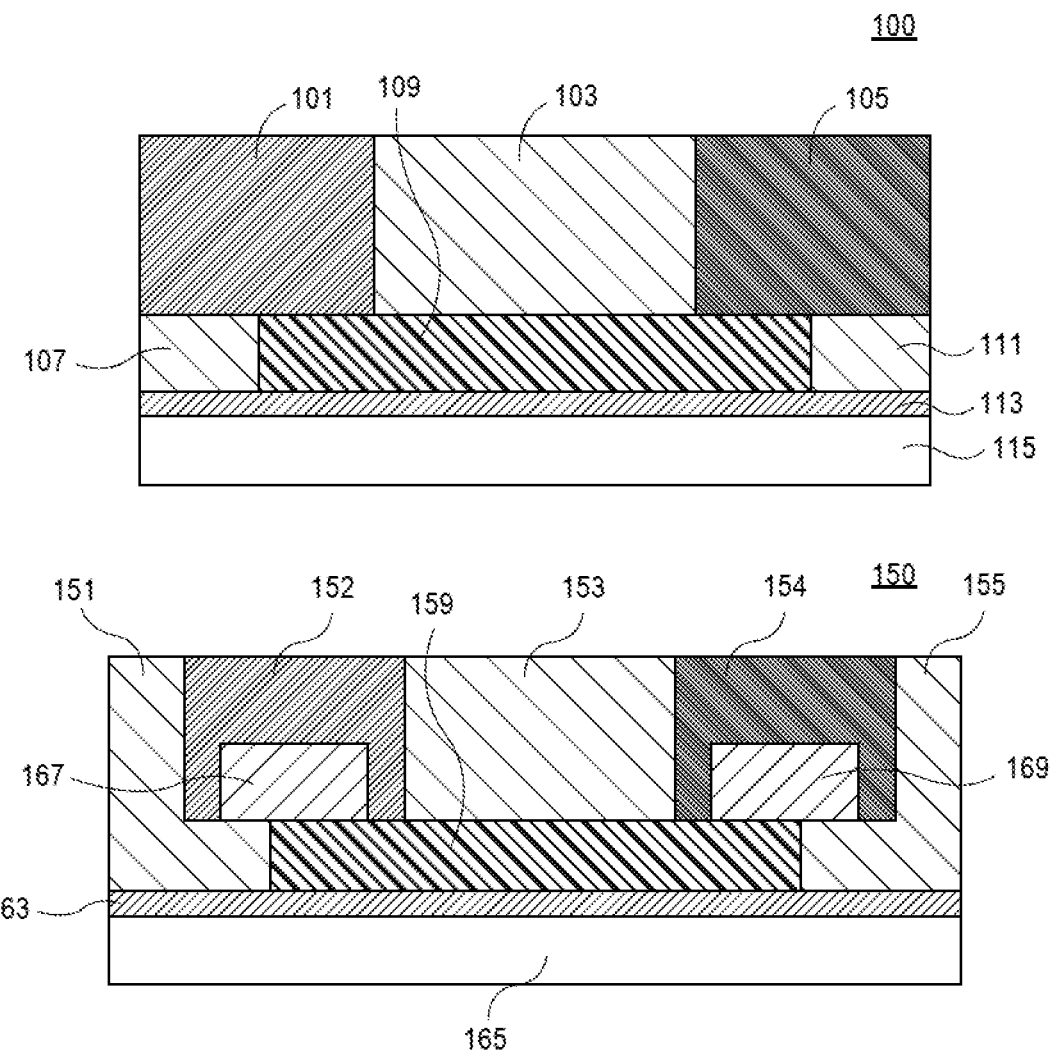
FIG. 1 is an illustration of a cross-sectional view of a transistor with planar source and drain contact interfaces and a cross-sectional view of a transistor with "wrap around" source and drain contact interfaces in accordance with an embodiment.

A wrap around contact for thin film transistors to improve contact resistance is described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

FIG. 1 is an illustration of a cross-sectional view of a transistor 100 with planar source and drain contact interfaces and a cross-sectional view of a transistor 150 with "wrap around" source and drain contact interfaces in accordance with an embodiment. The transistor 100 with the planar source and drain contact interfaces includes source contact 101, passivation layer 103, drain contact 105, passivation layer 107, channel 109, passivation layer 111, oxide layer 113 and back gate 115. The transistor 150 with the "wrap around" source and drain contact interfaces includes low-k passivation layer 151, source contact 152, low-k passivation layer 153, drain contact 154, low-k passivation layer 155, channel 159, gate dielectric 163, back gate 165, source semiconductor 167 and drain semiconductor 169.

The source contact 152 and the drain contact 154 are ohmic contacts that connect source and drain terminal conductors (not shown) to the semiconductor substrate. The source contact 152 and the drain contact 154 are configured to wrap around the source semiconductor 167 and the drain semiconductor 169 respectively. In particular, the source contact 152 and the drain contact 154 are formed to cover the side and top surfaces of the source semiconductor 167 and the drain semiconductor 169. This configuration of the source contact 152 and the drain contact 154 includes a vertical dimension that is not a part of the source contact and the drain contact structure of other approaches such as that of the transistor 100. The vertical parts of the contact interface of the source contact 152 and the drain contact 154 provide contact interface length/space that the source contact 101 and the drain contact 105 do not have.

The back-gate 165 is formed below the gate dielectric 163. The back-gate 165 modulates the flow of current in the channel 159. The channel 159 is formed below the source contact 152 and the drain contact 154. The conductivity of the channel 159 is a function of the potential applied across the terminals of the back-gate 165 and the source contact 152.

In an embodiment, the passivation layers 151, 153 and 155 can include but are not limited to low-k passivation materials such as silica-based materials, silsesquioxane-based (SSQ) materials, polymers and amorphous carbon. In other embodiments, the passivation layers 151, 153 and 155 can include any other suitable passivation materials. In an embodiment, the gate dielectric 163 can include but is not limited to high-k gate dielectric materials such as HfO2, Al2O3 and TiO2. In other embodiments, the gate dielectric 163 can include any other suitable passivation materials. In an embodiment, the source semiconductor 167 and the drain semiconductor 169 can include but are not limited to IGZO, InAs, InSb, Ge and Si. In other embodiments, the source semiconductor 167 and the drain semiconductor 169 can include any other suitable semiconductor material. In an embodiment, the source contact 152 and the drain contact 154 can include but are not limited to metals such as Ti, Mo, W, TiN and TaN. In other embodiments, the source contact 152 and the drain contact 154 can include any other suitable metals. In an embodiment, the channel 159 can include materials such as IGZO, ITO, ZnO, Ga2O3 and In2O3. In other embodiments, the channel 159 can include any other suitable material.

FIG. 1 enables a comparison of the planar source and drain contact interfaces of the transistor 100 to the "wrap around" source and drain contact interfaces of the transistor 150. As regards transistor 100, the source and drain contacts are formed on the transistor channel, to include planar, horizontal contact interface surfaces. These horizontal contact interface surfaces present challenges related to transistor length/area scaling. For example, as transistors having the contact structure of transistor 100 are scaled, the length of the horizontal contact area must be kept as large as possible in order to control contact resistance (because of the relationship between contact size and contact resistance), even though the horizontal length of the transistor itself is made smaller. In contrast, as regards the transistor 150, the wrap around design of the source contact 152 and the drain contact 154, which includes vertically oriented contact parts, provides a greater contact interface surface area for a horizontal contact dimension of a given length, as compared to that provided by the planar contact interface design of the source contact 101 and the drain contact 105 of the transistor 100. Thus, in embodiments, using a "wrap around" contact design, the contact interface surface length/area can be increased or maintained as the horizontal length of the transistor is made smaller.

It should be appreciated that increasing contact interface length without increasing the horizontal footprint of the contact reduces contact resistance and enables transistor scaling. Thus, in embodiments, scaling is enabled because the same contact interface length that is provided in a given horizontal contact dimension by conventional approaches can be provided in a smaller horizontal contact dimension. Consequently, in embodiments, transistors can be scaled to achieve higher chip density without increasing the contact resistance of the transistors and degrading device performance.

As such, embodiments overcome the contact scaling limitations of previous approaches (such as that of transistor 100 of FIG. 1) that present a barrier to increasing transistor density per unit area. As described herein, embodiments use the wraparound contact structure (which includes vertical contact areas) to maintain a large contact length (as compared to transfer length) such that continuous scaling of the horizontal source contact and drain contact dimensions can be achieved. Moreover, embodiments provide low-resistance, stable ohmic contacts that improve the performance and reliability of transistors. The wraparound contacts also reduce contact resistance and external resistance (Rext) for back gated geometries. In an embodiment, transistor types to which the described wrap around contact structure can be applied can include but are not limited to top gate, dual gate, tri-gate, gate-all-around and multilayer thin film transistor (TFT) devices.

In operation, when an appropriate voltage is applied across the source and the drain terminals and a voltage greater than Vth is applied to the back-gate 165, the transistor 150 turns on and current is caused to flow through the channel 159. The source contact 152 and the drain contact 154, which have a wrap-around structure as discussed in detail herein, provides a contact interface of reduced resistance that enables current to readily flow in both directions from the source contact 152 and/or the drain contact 154 to the source and the drain regions. It should be appreciated that the reduced contact resistance can improve device performance in manners that can include but are not limited to power dissipation and frequency response.

Figure 2:
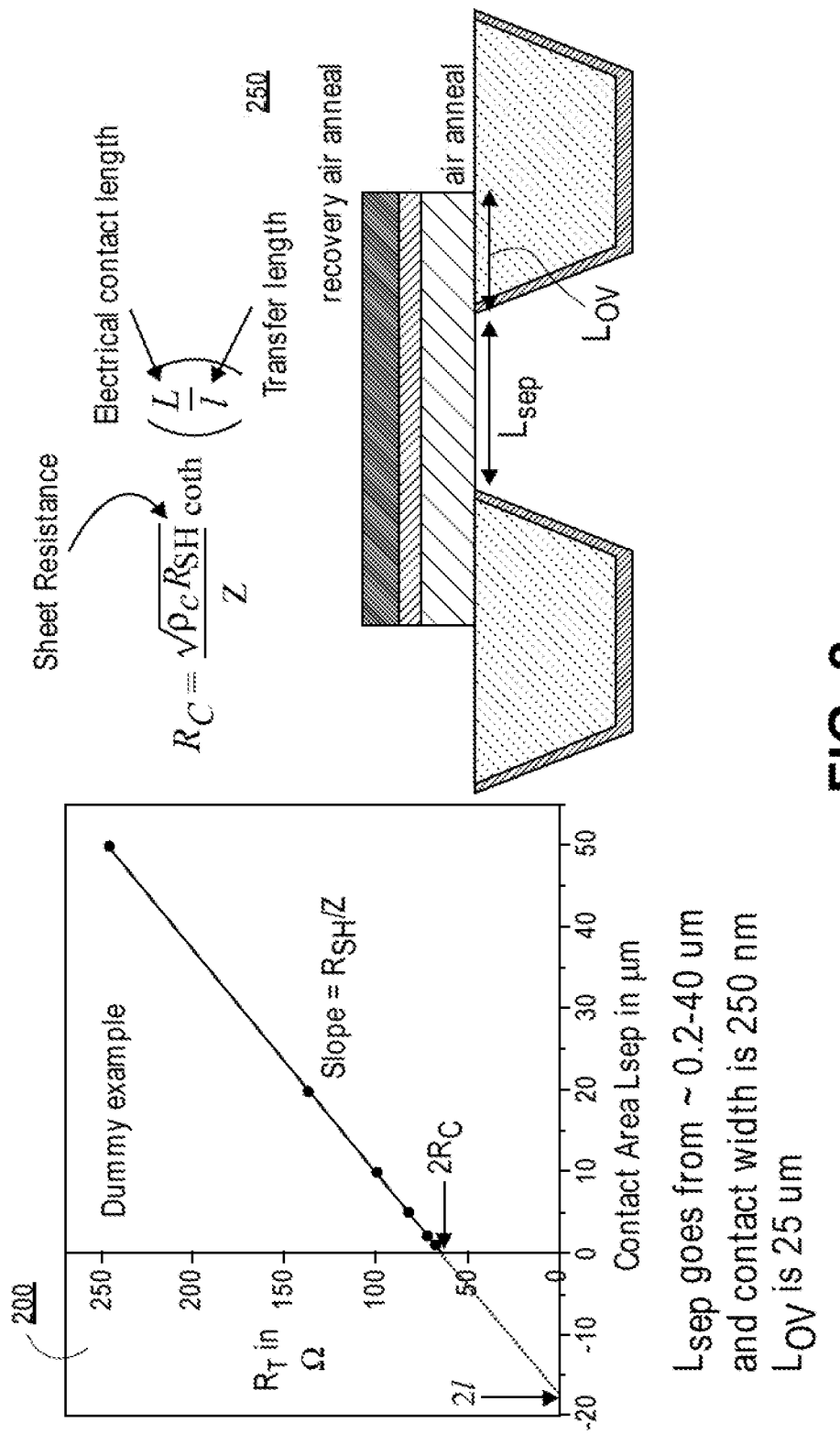
FIG. 2 shows a graph that illustrates the relationship of contact resistance (Rc) to contact length (L) and transfer length (l).

FIG. 2 shows a graph 200 that illustrates the relationship of Rc to L and transfer length l. Rc is the resistance to the flow of current across the interface of two materials. L is the length of the horizontal dimension of a contact. Transfer length l is the distance over which current conducts through a contact interface. Referring to FIG. 2, graph 200 shows that Rc decreases to a minimum when L is far greater than l. In FIG. 2, the contact resistances of several transistors are plotted that have different channel lengths (Lsep) but the same contact length L and gate overlap length Lov. For example, the Lsep of the transistors vary from approximately 0.2 to 40 um. However, the transistors each have a contact length of 250 nm and a gate overlap length Lov of 25 um. The graph shows the ideal value of Rc as being near the Y intercept where Lsep is approximately equal to zero (no channel region separating the source and drain regions). This is the point at which the total resistance is dominated by the contact resistance (as opposed to channel resistance). Likewise, ideal l is found at the X intercept (with respect to X=0 where channel resistance is ideally zero), indicating a point at which there would be no resistance. Importantly, as shown in FIG. 2, the contact length L of 250 nm is much greater than the ideal length of l. In embodiments, the wraparound source and drain contact approach described herein takes advantage of this relationship, maximizing the L to l ratio through use of the wraparound contact structure to ensure that L is much greater than l and that Rc is minimized.

Figure 3:
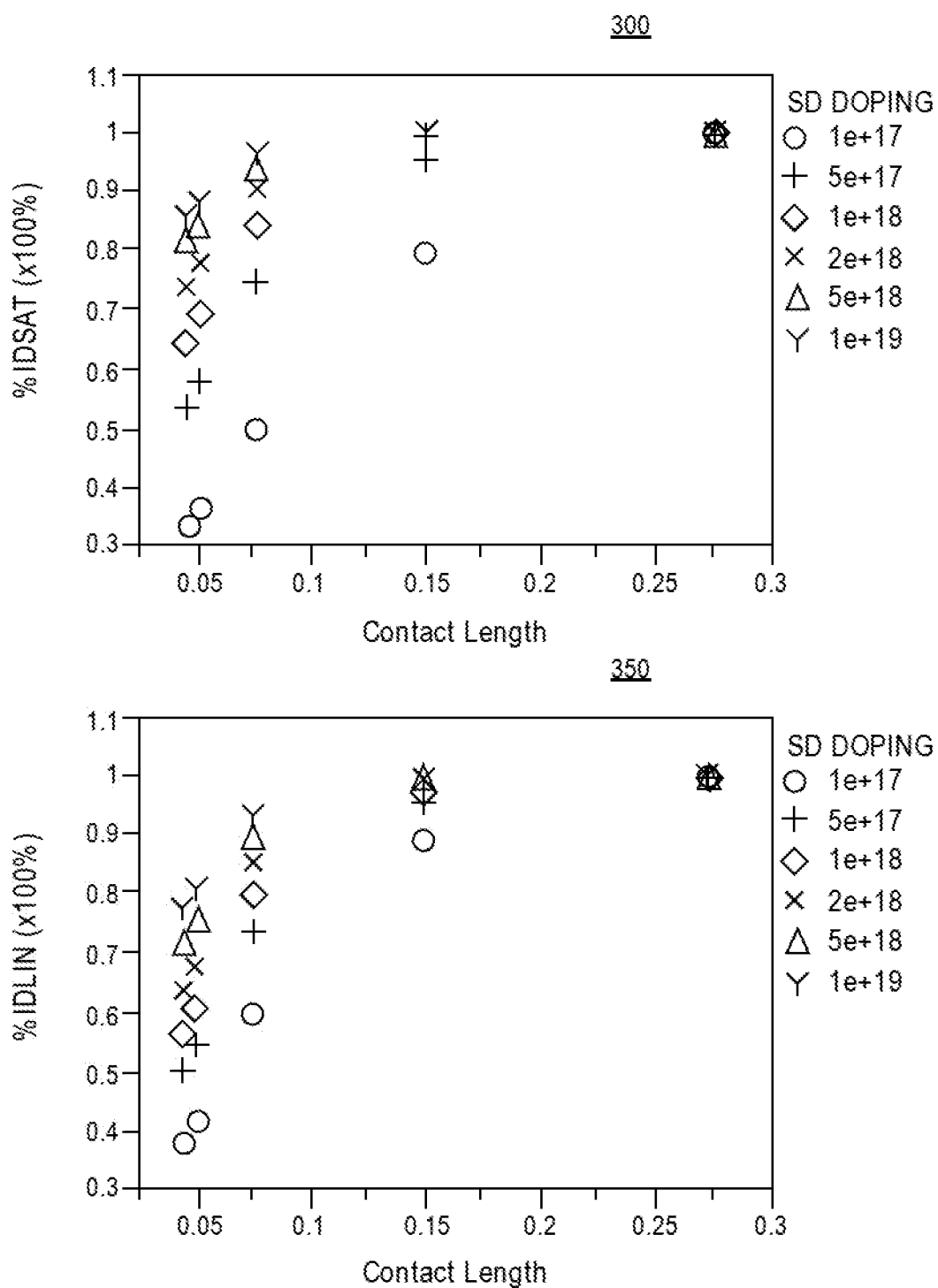
FIG. 3 shows saturation/linear current (IDSAT/IDLIN) of transistors as a function of contact length.

FIG. 3 shows graphs 300 and 350 that illustrate the relationship of saturation/linear current (IDSAT/IDLIN) of transistors to contact length (contact CD). Referring to FIG. 3, graph 300 illustrates that IDSAT is very dependent on the source drain (SD) doping level when contact length is reduced. Likewise, graph 350 illustrates that IDLIN is very dependent on the SD doping level when contact length is reduced. In particular, the lower the doping level, the lower the IDSAT and IDLIN for that contact length. Thus, when the source and drain cannot be doped to a very high level, the contact length needs to be sufficiently large such that the current is not degraded and IDSAT and IDLIN targets can be met. In an embodiment, the wraparound source contact and drain contact approach described herein can be used to ensure that the length of the source contact and the drain contact are sufficient to meet IDSAT and IDLIN targets.

Figure 4A:
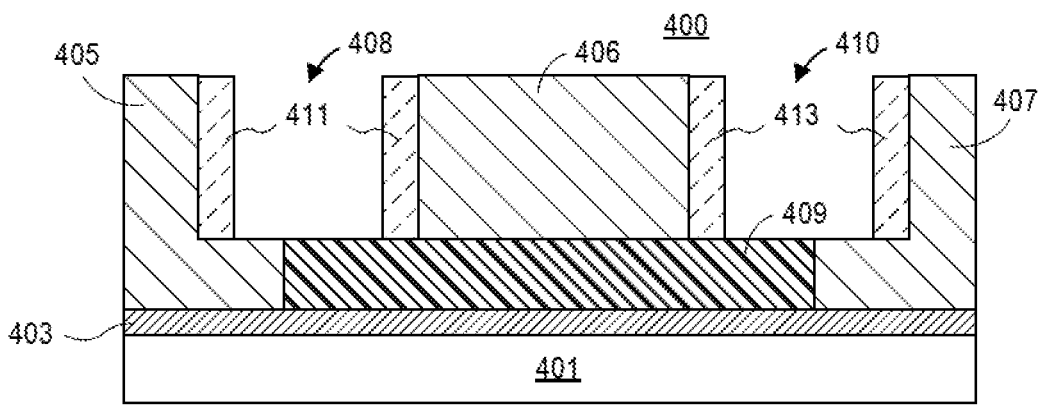
FIGS. 4A-4D are illustrations of cross-sectional views of a process for forming wraparound contacts according to an embodiment.

FIGS. 4A-4D illustrate a process for forming wraparound contact of a transistor 400 according to an embodiment. Referring to FIG. 4A, after the back-gate material 401, high-k dielectric material 403, low-k passivation material 405, low-k passivation material 406, low-k passivation material 407 and channel material 409 are formed, sacrificial layer 411 and sacrificial layer 413 are formed in a first trench 408 and a second trench 410. In an embodiment, the sacrificial layer 411 and the sacrificial layer 413 are used to mask underlying parts of the transistor that is being fabricated until one or more other fabrication operations have been completed. In an embodiment, the material used to form the sacrificial layer can include but are not limited to SiN, SiC, and SiO2. In an embodiment, the material used to form the sacrificial layer can include any suitable material for masking underlying parts until one or more operations are completed.

Figure 4B:
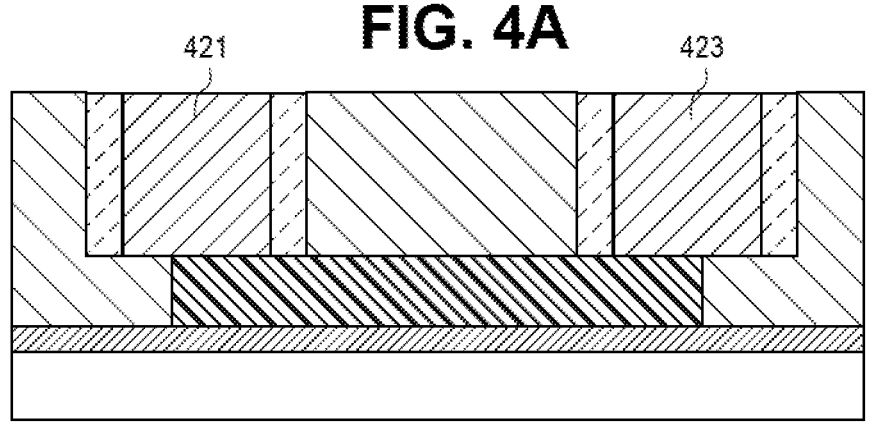

Referring to FIG. 4B, subsequent to one or more operations that result in the structure shown at FIG. 4A, semiconductor material 421 is formed in the first trench 408 and semiconductor material 423 is formed in the second trench 410 in the spaces defined by the sacrificial oxide 411 and the sacrificial oxide 413 respectively. In an embodiment, the semiconductor material 421 and the semiconductor material 423 is used to form a part of the source and drain contacts of the transistor 400. In one embodiment, the semiconductor material 421 and the semiconductor material 423 can include but is not limited to IGZO, InAs, InSb, Ge, and Si. In other embodiments, the semiconductor material 421 and the semiconductor material 423 can include other suitable semiconductor materials.

Figure 4C:
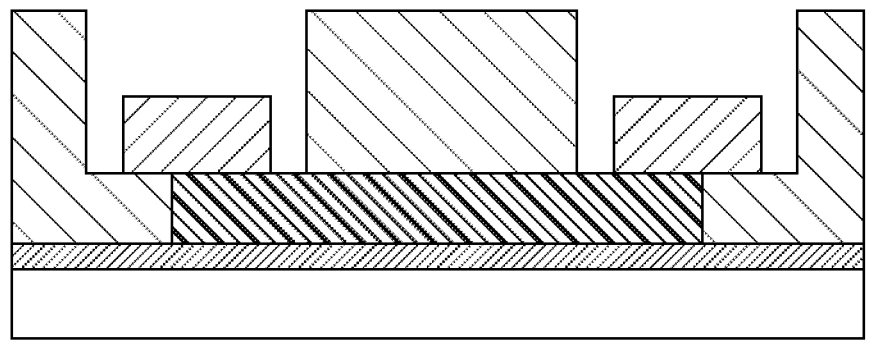

Referring to FIG. 4C, subsequent to one or more operations that result in the structure shown at FIG. 4B, the sacrificial layer 411 and the sacrificial layer 413 is removed (to expose trench sidewalls) and the semiconductor material 421 in the first trench 408 and the semiconductor material 423 in the second trench 410 is recessed. In an embodiment, the sacrificial layer 411 and the sacrificial layer 413 can be removed, and the semiconductor material 421 in the first trench 408 and the semiconductor material 423 in the second trench 410 can be recessed, by etching (e.g., wet etching). In other embodiments, the sacrificial layer 411 and the sacrificial layer 413 can be removed, and the semiconductor material 421 in the first trench 408 and the semiconductor material 423 in the second trench 410 can be recessed, in any other manner suitable for removing the sacrificial layer 411 and the sacrificial layer 413, and recessing the first semiconductor material 421 and the second semiconductor material 423.

Figure 4D:
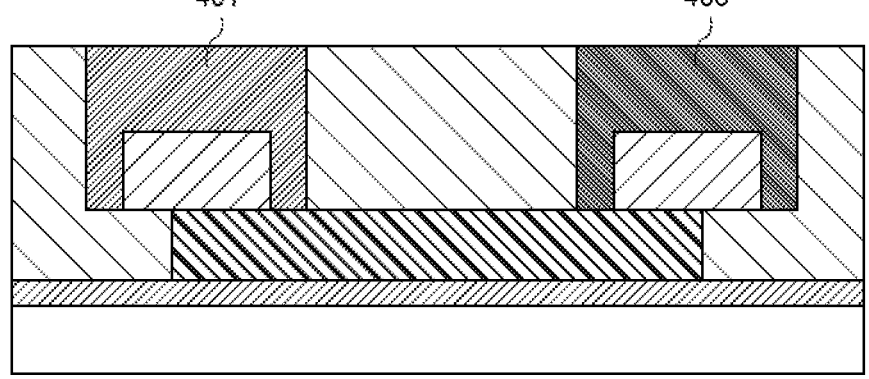

Referring to FIG. 4D, subsequent to one or more operations that result in the structure shown at FIG. 4C, first metal material 451 and second metal material 453 are formed in the first trench 408 and the second trench 410. As shown in FIG. 4D, first metal material 451 and second metal material 453 are formed in the spaces formed in the first trench 408 and the second trench 410 from the one or more operations of FIG. 4C. As shown, the first metal material 451 and the second metal material 453 are formed in the space that is created from the removal of the sacrificial oxide 411 and the sacrificial oxide 413, and the recessing of the first semiconductor material 421 and the second semiconductor material 423. In an embodiment, the metal material is used to form the source and the drain contacts. In an embodiment, the metal material can include but is not limited to Ti, Mo, W, TiN and TaN. In an embodiment, any suitable metal material can be used to form the source and the drain contacts.

Figure 5A:
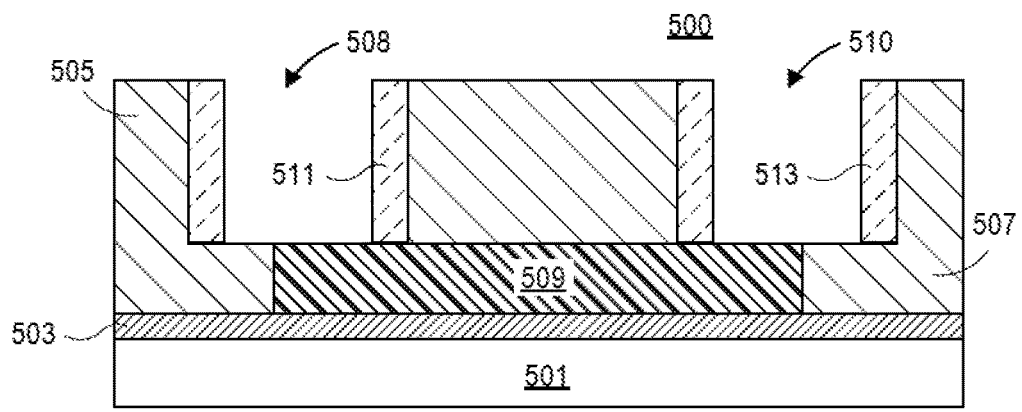
FIGS. 5A-5D are illustrations of cross-sectional views of a process for forming wraparound contacts according to an embodiment.

FIGS. 5A-5D illustrate a process for forming wraparound contacts according to an embodiment. Referring to FIG. 5A, after the back-gate material 501, high-k dielectric material 503, low-k passivation material 505, low-k passivation material 507 and channel material 509 are formed, the sacrificial layer 511 and the sacrificial layer 513 are formed in the first trench 508 and the second trench 510. In an embodiment, the sacrificial layer 511 and the sacrificial layer 513 are used to mask underlying parts of the transistor that are being fabricated until one or more other fabrication operations have been completed. In an embodiment, the material used to form the sacrificial layer 511 and the sacrificial layer 513 can include but are not limited to SiN, SiC and SiO2. In an embodiment, the material used to form the sacrificial layer 511 and the sacrificial layer 513 can include any suitable material for masking underlying parts until one or more operations are completed.

Figure 5B:
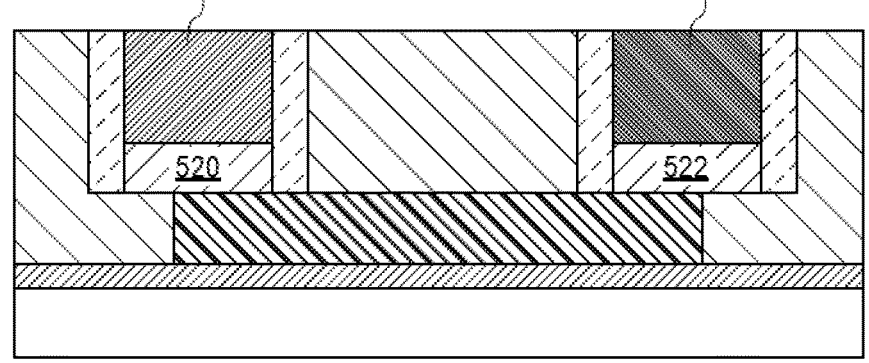

At FIG. 5B, subsequent to one or more operations that result in the structure shown at FIG. 5A, first semiconductor material 520 and second semiconductor material 522 are formed at the bottom of the first trench 508 and the second trench 510 in the space defined by the sacrificial oxide 511 and the sacrificial oxide 513. In addition, the first metal material 521 and the second metal material 523 are formed above the first semiconductor material 520 and the second semiconductor material 522 formed at the bottom of the first trench 508 and the second trench 510 in the space defined by the sacrificial oxide 511 and the sacrificial oxide 513. In one embodiment, the semiconductor material can include but is not limited to IGZO, InAs, InSb, Ge, and Si. In other embodiments, other suitable semiconductor material can be used. In an embodiment, the metal material can include but is not limited to Ti, Mo, W, TiN and TaN. In other embodiments, other suitable metal material can be used.

Figure 5C:
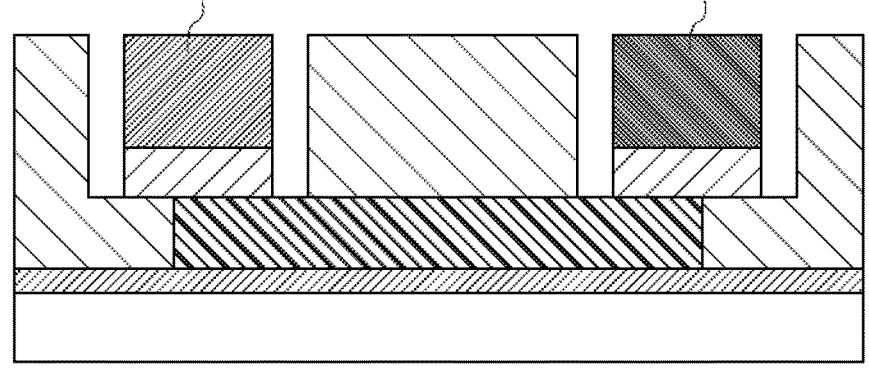

Referring to FIG. 5C, subsequent to one or more operations that result in the structure shown at FIG. 5B, the sacrificial layer 511 and the sacrificial layer 513 are removed. In an embodiment, the sacrificial layer 511 and the sacrificial layer 513 can be removed by etching. In other embodiments, the sacrificial layer 511 and the sacrificial layer 513 can be removed in any other manner suitable for removing a sacrificial layer.

Figure 5D:
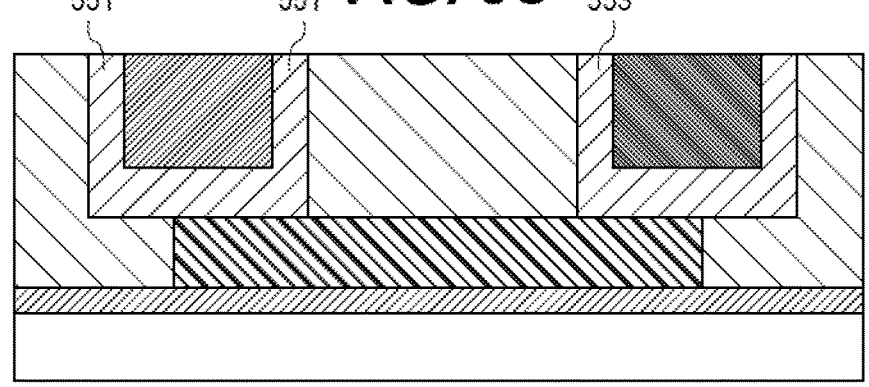

Referring to FIG. 5D, subsequent to one or more operations that result in the structure shown at FIG. 5C, a semiconductor material 551 and a semiconductor material 553 are formed in the first trench 508 and the second trench 510 in the spaces formed in the first trench 508 and the second trench 510 as shown in FIG. 5C (the spaces formed by the removal of the sacrificial layer 511 and the sacrificial layer 513). Referring to FIG. 5D, the semiconductor material 551 is formed in the space that is created from the removal of the sacrificial oxide 511 and the semiconductor material 553 is formed in the space that is created from the removal of the sacrificial layer 513. In one embodiment, the semiconductor material can include but is not limited to IGZO, InAs, InSb, Ge, and Si. In other embodiments, other suitable semiconductor material can be used.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
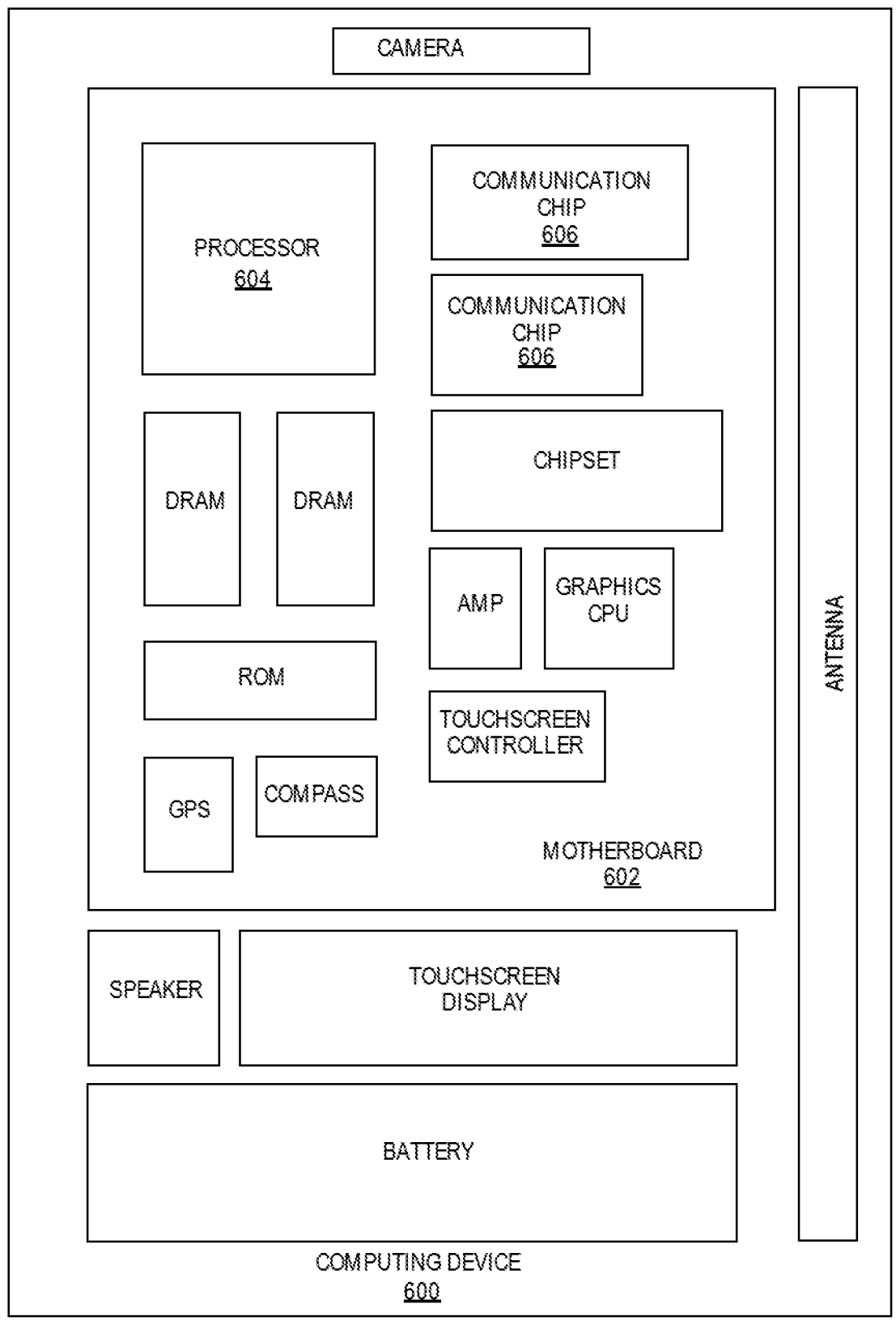
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
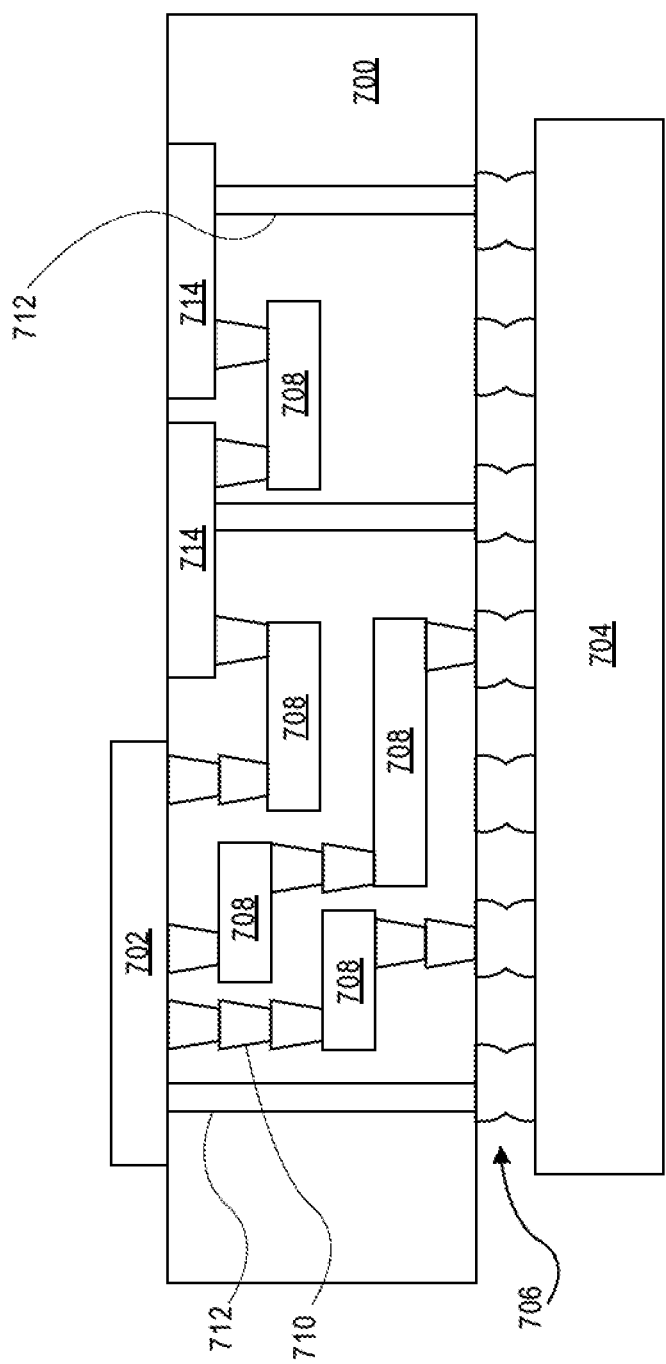
FIG. 7 illustrates an interposer that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 400.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A transistor comprises a substrate, a first semiconductor structure above the substrate, a second semiconductor structure above the substrate, a source contact comprising a first metal structure that contacts a plurality of surfaces of the first semiconductor structure, and a drain contact comprising a second metal structure that contacts a plurality of surfaces of the second semiconductor structure. The transistor further comprises a gate contact below a back side of the substrate.

Example Embodiment 2

The transistor of example embodiment 1 further comprising an oxide layer below the substrate.

Example Embodiment 3

The transistor of example embodiment 2 wherein the gate contact is below the oxide layer.

Example Embodiment 4

The transistor of example embodiment 1 wherein the first metal structure and the second metal structure contact the substrate and a passivation layer.

Example Embodiment 5

The transistor of example embodiment 1, 2, 3 or 4 wherein the first semiconductor structure and the second semiconductor structure contact the substrate and a passivation layer.

Example Embodiment 6

The transistor of example embodiment 1 wherein a contact length of the source contact is greater than a transfer length associated with the source contact.

Example Embodiment 7

The transistor of example embodiment 1, 2, 3, 4, 5, or 6 wherein a contact length of the drain contact is greater than a transfer length associated with the drain contact.

Example Embodiment 8

A method of forming transistor contacts comprises forming a first trench and a second trench, forming sacrificial material on inner sidewalls of the first trench and inner sidewalls of the second trench, filling the first trench and the second trench with semiconductor material, removing the sacrificial material from the inner sidewalls of the first trench and the inner sidewalls of the second trench, and recessing the semiconductor material in the first trench and the semiconductor material in the second trench. Metal is formed above and on sides of the recessed semiconductor material in the first trench and the recessed semiconductor material in the second trench.

Example Embodiment 9

The method of example embodiment 8 further comprising forming an oxide layer on a back side of the substrate.

Example Embodiment 10

The method of example embodiment 9 further comprising forming a gate contact on the oxide layer.

Example Embodiment 11

The method of example embodiment 8, 9 or 10 wherein the metal formed on the sides of the recessed semiconductor material in the first and the second trench contact a top surface of the substrate.

Example Embodiment 12

The method of example embodiment 8 wherein a contact length of the metal above and on sides of the recessed semiconductor material in the first trench is greater than a transfer length associated with the metal above and on sides of the recessed semiconductor material in the first trench.

Example Embodiment 13

The method of example embodiment 8, 9, 10, 11, or 12 wherein the metal comprises a source contact in the first trench and a drain contact in the second trench.

Example Embodiment 14

The method of example embodiment 8 wherein the first trench and the second trench are formed above a channel region.

Example Embodiment 15

A method of forming transistor contacts comprises forming a first trench and a second trench in a semiconductor substrate, forming sacrificial material on inner sidewalls of the first trench and on inner sidewalls of the second trench, forming a semiconductor layer on a bottom of the first trench and a bottom of the second trench, filling the first trench and the second trench with a first metal material above the semiconductor layer, and removing the sacrificial material from the inner sidewalls of the first trench and the inner sidewalls of the second trench. A second metal material is formed on the inner sidewalls of the first trench and the inner sidewalls of the second trench.

Example Embodiment 16

The method of example embodiment 14 further comprising forming an oxide layer on a back side of the substrate.

Example Embodiment 17

The method of example embodiment 15 further comprising forming a gate contact on the oxide layer.

Example Embodiment 18

The method of example embodiment 14 wherein a contact length of the first and second metal material is greater than a transfer length associated with the first and second metal material in the second trench.

Example Embodiment 19

The method of example embodiment 14 wherein the first metal material and the second metal material comprises a source contact in the first trench and a drain contact in the second trench.

Example Embodiment 20

The method of example embodiment 14 wherein the first trench and the second trench are formed above a channel region and a passivation layer.

What is claimed is:
1. A transistor, comprising:
   a substrate comprising a channel structure;
   a first semiconductor structure above the channel structure;
   a second semiconductor structure above the channel structure;

a source contact comprising a first metal structure that contacts a plurality of surfaces of the first semiconductor structure, the plurality of surfaces comprising a top surface, a first side surface and a second side surface;

a drain contact comprising a second metal structure that contacts a plurality of surfaces of the second semiconductor structure, the plurality of surfaces comprising a top surface, a first side surface and a second side surface; and a gate contact below a back side of the substrate.

2. The transistor of claim 1 further comprising an oxide layer below the substrate.

3. The transistor of claim 2 wherein the gate contact is below the oxide layer.

4. The transistor of claim 1 wherein the first metal structure and the second metal structure contact the substrate and a passivation layer.

5. The transistor of claim 1 wherein the first semiconductor structure and the second semiconductor structure contact the substrate and a passivation layer.

6. The transistor of claim 1 wherein a contact length of the source contact is greater than a transfer length associated with the source contact.

7. The transistor of claim 1 wherein a contact length of the drain contact is greater than a transfer length associated with the drain contact.

* * * * *